United States Patent [19]

Madland

[11] Patent Number: 4,727,518
[45] Date of Patent: Feb. 23, 1988

[54] APPARATUS FOR LIMITING MINORITY CARRIER INJECTION IN CMOS MEMORIES

[75] Inventor: Paul D. Madland, Beaverton, Oreg.

[73] Assignee: Intel Corporation, Santa Clara, Calif.

[21] Appl. No.: 581,285

[22] Filed: Feb. 17, 1984

[51] Int. Cl.⁴ .............................................. G11C 11/40
[52] U.S. Cl. ....................................... 365/226; 357/51
[58] Field of Search .............. 365/226, 227, 228, 229; 307/477; 357/51, 59

[56] References Cited

U.S. PATENT DOCUMENTS

| | | | |
|---|---|---|---|
| 3,974,404 | 10/1976 | Davis | 307/477 |
| 4,139,786 | 2/1979 | Raymond, Jr. et al. | 365/222 |
| 4,152,627 | 5/1979 | Priel et al. | 365/227 |
| 4,323,986 | 4/1982 | Malaviva | 365/177 |
| 4,367,509 | 1/1983 | Snyder et al. | 357/51 |

Primary Examiner—James W. Moffitt
Attorney, Agent, or Firm—Blakely, Sokoloff, Taylor & Zafman

[57] ABSTRACT

A CMOS array is described where the memory cells are formed in n-type wells. No back biasing is employed. To prevent generation of minority carriers within the wells, on-chip filtering of power used for the devices in the wells and for biasing the wells is employed. Other techniques are used to reduce problems associated with minority carrier generation.

14 Claims, 5 Drawing Figures

APPARATUS FOR LIMITING MINORITY CARRIER INJECTION IN CMOS MEMORIES

BACKGROUND OF THE INVENTION

1. Field of the Invention

The invention relates to the field of methods and apparatuses for preventing minority carrier injection, such as caused by forward biased junctions in semiconductor memories.

2. Prior Art

In complementary metal-oxide-semiconductor (CMOS) memories, particularly where an array is formed in a well of a first conductivity type and the well is disposed in a substrate of a second conductivity type, there is always the possibility that a junction can become forward biased. For instance, where a five volt potential is applied to a p-type region in an n-type well where the well is also biased to five volts, power supply noise along with the distributed resistance and capacitance of the well can cause the p-type region to become forward biased. This injects minority carriers into the n-well which results in problems. In the case of dynamic RAMs, these minority carriers can be collected by a memory cell, altering the stored binary state. This problem will be described in more detail in conjunction with FIG. 1.

For the most part, the prior art has avoided this problem by using back biasing. Often, an on-chip generator (charge pumping circuit) produces a potential higher than or lower than the power supply potential to permit back biasing of wells, substrates, or the like. These generators consume relatively large amounts of power, particularly when compared to the standby power required by a CMOS dynamic memory. Thus, while back biasing prevents the undesirable generation of minority carriers, it has the disadvantage of consuming power.

In other dynamic memories, where back biasing is not required, more complex processing is used. Arrays are not fabricated in the more simply formed wells. Rather, epitaxial layers are employed to allow low resistance paths to the substrate.

As will be seen, the present invention provides a relatively easy to fabricate apparatus for preventing the generation of the minority carriers within a well. The invention is particularly useful where dynamic memory cells are formed in a well.

SUMMARY OF THE INVENTION

An improvement in a metal-oxide-semiconductor (MOS) memory where a plurality of memory cells are fabricated in a well of a first conductivity type, the well being formed in a substrate of a second conductivity type. A separate power distribution bus is formed on the substrate for providing power to the memory cells and other circuits in the well. This bus is also coupled to the well for biasing the well. A resistor is formed on the substrate and connected into the bus for providing filtering of the power distributed by the bus. This filtering prevents forward biasing from occurring and thus prevents the generation of minority carriers. Other techniques are also disclosed for reducing the generation of the minority carriers.

DETAILED DESCRIPTION OF THE INVENTION

An apparatus for preventing the generation or injection of minority carriers in a CMOS memory without the use of back biasing is described. The invented apparatus is particularly useful where a dynamic memory array is formed within a well. In the following description, numerous specific details are set forth such as specific conductivity types in order to give a thorough understanding of the present invention. However, it will be obvious to one skilled in the art that the present invention may be practiced without these specific details. In other instances, well-known structures and processes have not been described in detail in order not to unnecessarily obscure the present invention.

Figure 1:
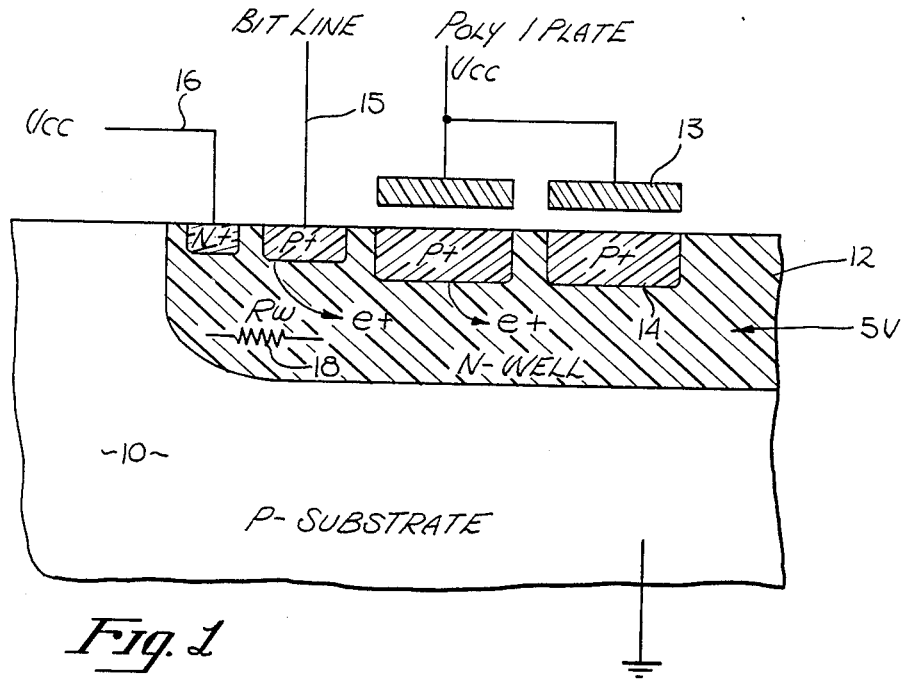
FIG. 1 is a cross-sectional elevation view of a portion of a memory array used to describe the problem solved by the present invention.

Referring to FIG. 1, a cross-sectional elevation of a p-type silicon substrate 10 is illustrated. It is assumed for purposes of discussion that a memory array of dynamic memory cells is formed within an n-well 12. The memory cells include capacitors which are fabricated from polysilicon plates 13 and p+ substrate regions 14. The bit line 15 is also connected to the n-well 12 through a p+ region. As shown, the plates 13 are connected to a $V_{CC}$ potential (e.g., +5 volts). Also during memory operation the line 15, at certain times, is connected to the five volts supply potential. The well 12 is biased through line 16 to the power supply potential. For a more complete discussion of a CMOS dynamic RAM where memory cells are formed in n-wells, see copending application, entitled "CMOS DYNAMIC RANDOM-ACCESS MEMORY WITH MULTIPLEX SENSE AMPLIFIER", filed on Feb. 22, 1984, Ser. No. 582,526, now U.S. Pat. No. 4,584,672, and assigned to the assignee of the present invention.

The potential from a power supply used for dynamic RAMs, even though generally well regulated, contains transients and noise. The load placed on the power supply by dynamic RAMs is not constant. It varies from active cycles to standby cycles in addition to variations within the cycles. The power supply typically includes in addition to resistance, both capacitance and inductance. The changes in current to the memory causes a ringing in the power supply, resulting in transients or noise. There are other sources of noise, such as fluctuation in the DC power supply.

As shown in FIG. 1, the n-well 12 has inherent distributed resistance 18. Also, there is considerable distributed capacitance associated with this well. While this well is connected to the power supply potential through line 16, the resistance 18 and capacitance acts as a filter through which the power must be transmitted throughout the well. On the other hand, some of the p+ junctions, such as that associated with bit line 15 are at times more directly connected to the power supply potential (that is, the power is not coupled through resistor 18). A fluctuation in power supply potential thus, may cause line 15 to rise in potential more quickly than the bias of the n-well 12. This will forward bias the p+ region, causing minority carriers (holes in this case) to be injected into the n-well. The regions 14 can also cause the generation of minority carriers since they are closely coupled to the plates 13 and may become forward biased as the potential on the plates changes more quickly than that of the well.

The minority carriers can recombine under plates changing the binary state stored in a cell. This, of course, results in an error. This problem can be alleviated by refreshing the memory more frequently. Obviously, this has the disadvantage of limiting access to the memory. In the presently preferred embodiment, a refresh cycle occurs once every four msec. To avoid more frequent refreshing, less than six holes can be collected per refresh cycle. (Forward biasing of as little as a 100-200 millivolts can cause a problem.)

Figure 2:
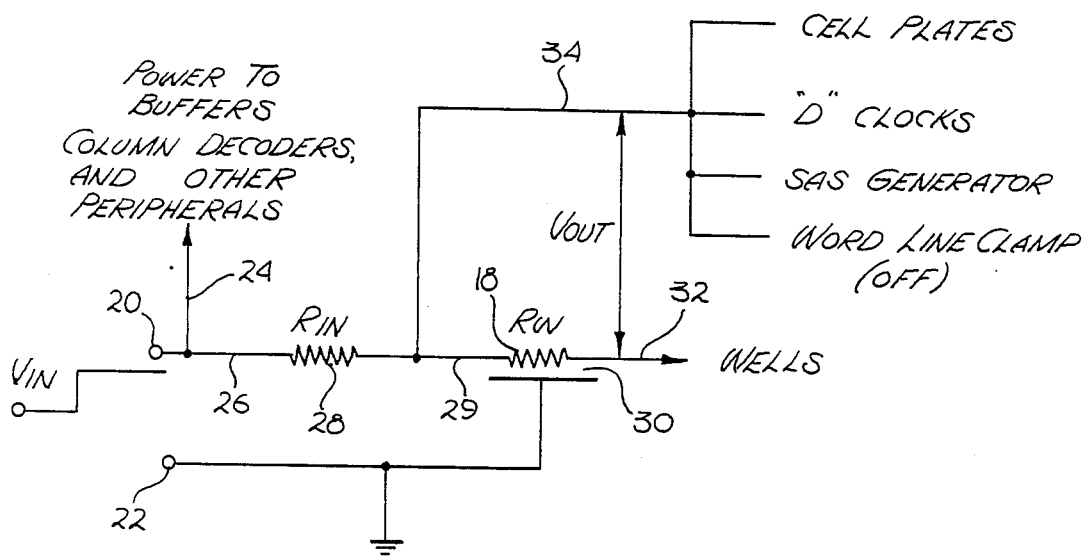
FIG. 2 is an electrical schematic illustrating the present invention.

Referring to FIG. 2 with the present invention, the input power is distributed through two separate bus systems. The input power is shown as node 20 in FIG. 2. This node is coupled to two separate buses, buses 24 and 26. Bus 24 is coupled directly to most of the peripheral circuits such as the buffers, column decoders, etc. Bus 26 is coupled through a resistor 28 and this bus through line 29 is used to bias the n-wells. Also, this bus, through line 34, is used for the cell plate potential (plates 13 of FIG. 1), for the generation of the "D" clock signals which will be described, for the sense amplifier strobe (SAS) signal generator, and for the word line clamp potential. The SAS signal drives bit lines to the power supply potential. Line 34 also supplies power for any other p+ regions formed in selected n-wells which receive the power supply potential from line 29 such as the array wells and sense amplifier wells.

Line 34 of bus 26 is used to supply power to circuits within the n-wells, and to certain circuits which provide signals to the n-wells The D clock signals are used by the sense amplifier to provide compensation through capacitors, therefore it is powered from bus 26. (This compensation is described in the above-mentioned co-pending application.) The SAS signal is connected to the bit line 15 during restoration. The word lines are closely coupled to p-type regions disposed within the n-well 12 of FIG. 1. The "off" potential for these devices is obtained from the filtered bus 26 to prevent conduction by the select transistors when they are off.

Figure 3:
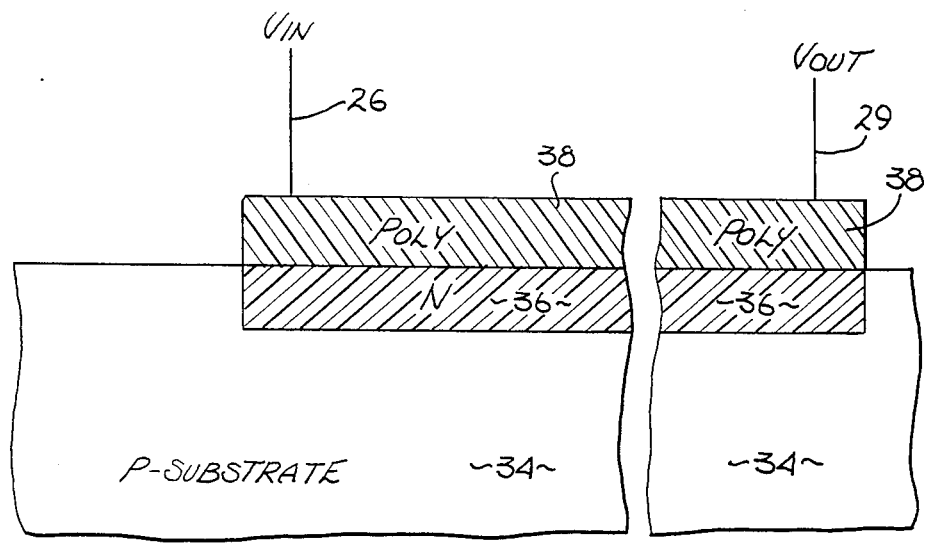
FIG. 3 is a cross-sectional elevation view of a portion of a substrate which illustrates a resistor used with the present invention.

In the presently preferred embodiment, two buses 26 are used, one for providing power to the memory arrays disposed on one side of the memory and the other for providing power to the memory arrays disposed on the other side of the memory. Thus, two resistors 28 are used, one in each bus. Each resistor 28 is formed in the p-type substrate of the memory in several sections. (Several sections are used as a matter of convenience in the preferred layout.) Each section includes an n-type region 36 and an overlying polysilicon member 38 as shown in FIG. 3. The exact form of the resistor 38 is not critical to the present invention. The resistor, for instance, may be entirely fabricated from polysilicon. In the presently preferred embodiment, each resistor has a resistance of 5-10 ohms; the maximum voltage drop across each resistor is approximately 1 volt. This maximum voltage drop, however, only occurs during brief high current periods, namely during sensing and restoring. The average heat dissipation from these resistors is not significant.

Figure 4:
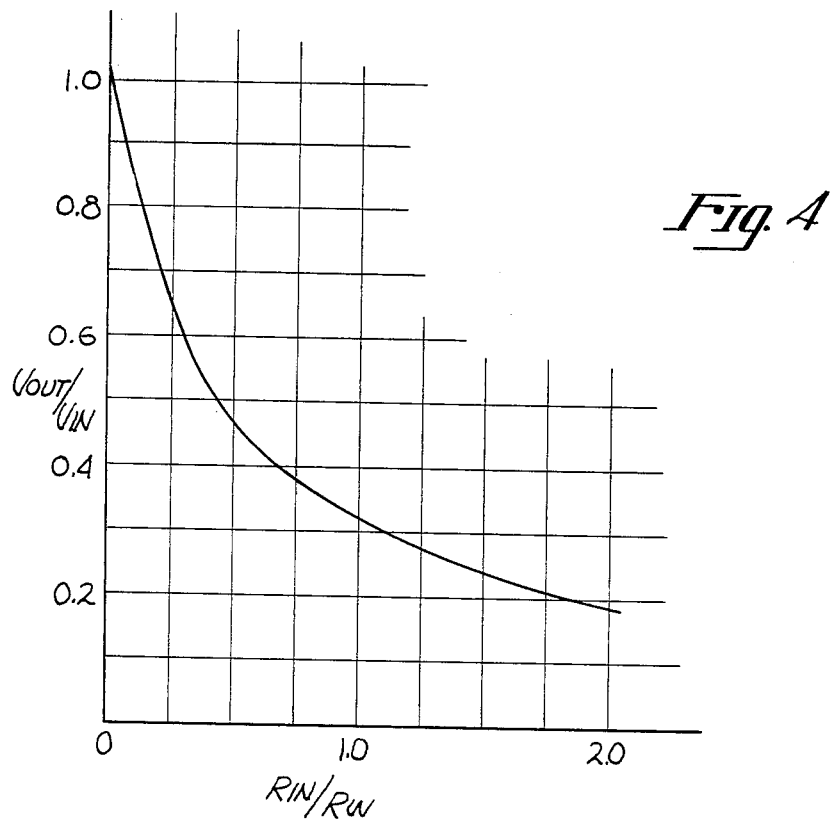
FIG. 4 is a graph used to describe the improvement obtained with the present invention.

Referring again to FIG. 2, the well resistance 18 along with the parasitic capacitance 30 associated with the well is shown. The potential between lines 32 and 34 ideally should be zero, but as mentioned, due to fluctuations in current, these two lines, at times, are at different potentials. It is this potential which causes the forward biasing discussed above. The graph of FIG. 4 plots the ratio of $V_{OUT}/V_{IN}$ (ordinate) versus the ratio of $R_{IN}$ (resistor 28)/ $R_W$ (resistor 18), (abscissa). The ratio of $V_{OUT}/V_{IN}$ ideally should be zero (i.e., $V_{OUT}=0$). However, because of resistance 18 and capacitance 30, this ideal condition particularly when current is fluctuating cannot be obtained. From an examination of FIG. 4, it is apparent that $V_{OUT}/V_{IN}$ can be decreased by increasing $R_{IN}$ or decreasing $R_W$. The worst case exists when there is no $R_{IN}$. There are practical limitations on increasing $R_{IN}$, namely too large a voltage drop leaving insufficient voltage to properly operate circuits from bus 34. As mentioned, in the presently preferred embodiment, $R_{IN}$ comprises two resistors each having a resistance of 5-10 ohms.

Figure 5:
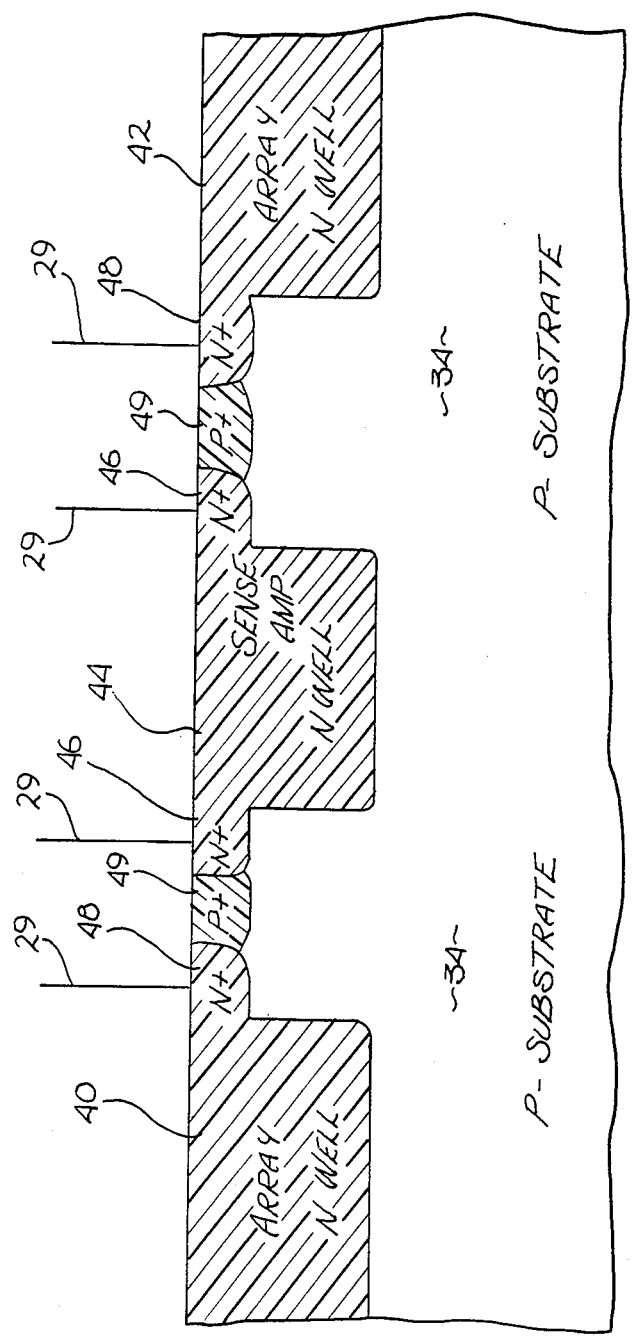
FIG. 5 is a cross-sectional elevation view of a substrate used to describe the preferred embodiment of the present invention.

In the present invention, several steps are taken to reduce $R_W$ and to also reduce the problems associated with the generation of minority carriers. In FIG. 5, a substrate 34 is illustrated upon which the CMOS memory is fabricated. The n-wells 40 and 42 are formed in the p-type substrate and are spaced-apart. N-well 44 is disposed between wells 40 and 42. As described in the above referenced application, memory cells are formed in the wells 40 and 42 with sense amplifiers being formed in the well 44. The well 44 is separated from the wells 40 and 42 by p+ regions 49 which are grounded. The well 44 is surrounded by a n+ guard ring 46. A plurality of straps or contacts 29 are coupled between the line 34 of FIG. 2 and the ring 46 to bias this well. By using a plurality of contacts 29, the resistance is reduced. This reduces the effect of the bipolar parasitic transistor created by p+ junctions, the sense amplifier well and the substrate.

Several nodes of the sense amplifiers are driven to the $V_{CC}$ potential. By placing the sense amplifiers in separate n-wells, that is, spaced-apart from the memory cells in wells 40 and 42, the minority carriers which are generated within well 44 are isolated from the memory cells, and hence, are less likely to cause a problem.

All the memory cells are formed within the n-wells 40 and 42 and like wells, that is, all the memory cells are spaced-apart in separate wells from the sense amplifiers and other circuitry. There are numerous n+ regions such as regions 48 disposed both on the periphery of the array wells and in the array wells which receive contacts or straps 29. This reduces the $R_W$ shown in FIG. 2, again reducing the generation of minority carriers.

Other steps are taken to improve the power distribution for the arrays. Specifically, the $V_{CC}$ bus 29 to the n-wells is widened to insure voltage uniformity throughout each section of n-well and the polysilicon plates used in the arrays. In the preferred embodiment, a plurality of n-wells are used as described in the above-referenced application, and care is taken in distributing powers to each of these arrays to make sure that they remain at the same potential.

Thus, with the above described separate power bus, a back bias generator is not needed to prevent the generation of the minority carriers. This is of substantial advantage in large capacity arrays where it is important to conserve the total power consumed by the chip.

What is claimed is:

1. In a metal-oxide-semiconductor (MOS) memory where a plurality of memory cells are fabricated in a well of a first conductivity type, said well being formed in a substrate of a second conductivity type, an improvement comprising:
   a separate distribution bus disposed on said substrate for providing power to said memory cells formed in said well and coupled to said well for biasing said well; and,
   a resistor formed on said substrate, in series with said bus for providing filtering of power distributed to said memory cells by said bus,
   whereby minority carrier generation in said well is reduced.

2. The improvement defined by claim 1 wherein a plurality of contacts are used from said bus to said well to reduce the resistance associated with said biasing of said well.

3. The improvement defined by claim 1 wherein said memory includes sense amplifiers, said sense amplifiers being disposed in a second well of said first conductivity type.

4. The improvement defined by claim 3 wherein said separate bus is connected to said second well for biasing said second well.

5. The improvement defined by claim 4 wherein a plurality of contacts are coupled between separate bus and said second well.

6. The improvement defined by claim 5 wherein said separate bus is coupled to a generator which provides the sense amplifier strobe signal for driving bit lines to the power supply potential.

7. The improvement defined by claims 1 or 5 wherein said memory cells includes polysilicon plates which are coupled to said separate bus.

8. In a metal-oxide-semiconductor (MOS) dynamic random-access memory (RAM) where a plurality of memory cells are fabricated in an n-type well formed in a p-type substrate, an improvement comprising:
   a first and a second power distribution bus, said first power distribution bus being coupled to power, at least some decoders and buffers;
   said second power distribution bus being coupled to provide power to said memory cells and coupled to said well for biasing said well;
   a resistor formed on said substrate and coupled to said second bus for providing filtering of power distributed by said second bus;
   whereby minority carrier generation in said well is reduced.

9. The improvement defined by claim 8 wherein a plurality of contacts are used between said second bus and said well to reduce the resistance associated with said biasing of said well.

10. The improvement defined by claim 8 wherein said memory includes a plurality of sense amplifiers, said sense amplifiers being disposed in second n-type wells, said second wells being spaced-apart from said wells which contain said memory cells.

11. The improvement defined in claim 10 wherein a plurality of contacts are used to interconnect said second well with said second bus.

12. The improvement defined by claims 8 or 10 wherein said second bus supplies power to a generator which generates a sense amplifier strobe signal for driving bit lines to the power supply potential.

13. The improvement defined by claims 8 or 10 wherein said second bus is coupled to supply power to plates which are part of said memory cells.

14. The improvement defined by claims 8 or 10 wherein said second bus provides a clamping potential for word lines used in said memory.

* * * * *